(12) United States Patent
Park et al.

(10) Patent No.: US 12,249,395 B2
(45) Date of Patent: Mar. 11, 2025

(54) MEMORY DEVICE SUPPORTING IN-MEMORY MAC OPERATION BETWEEN TERNARY INPUT DATA AND BINARY WEIGHT USING CHARGE SHARING METHOD AND OPERATION METHOD THEREOF

(71) Applicant: KOREA UNIVERSITY RESEARCH AND BUSINESS FOUNDATION, Seoul (KR)

(72) Inventors: Jongsun Park, Seoul (KR); Sung Soo Cheon, Seoul (KR); Kyeong Ho Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 165 days.

(21) Appl. No.: 18/101,287

(22) Filed: Jan. 25, 2023

(65) Prior Publication Data
US 2023/0253019 A1  Aug. 10, 2023

(30) Foreign Application Priority Data
Feb. 10, 2022 (KR) .................. 10-2022-0017302

(51) Int. Cl.
*G11C 7/00* (2006.01)
*G11C 5/06* (2006.01)
(Continued)

(52) U.S. Cl.
CPC .............. *G11C 7/109* (2013.01); *G11C 5/063* (2013.01); *G11C 7/16* (2013.01)

(58) Field of Classification Search
CPC ............ G11C 7/109; G11C 5/063; G11C 7/16; G11C 7/1096; G11C 7/12; G11C 7/1006;
(Continued)

(56) References Cited

U.S. PATENT DOCUMENTS

| 8,117,567 B2 * | 2/2012 | Arsovski | G11C 7/1006 365/204 |
| 11,355,167 B2 * | 6/2022 | Seok | G11C 7/1036 |

(Continued)

FOREIGN PATENT DOCUMENTS

| JP | 2019-194931 A | 11/2019 |
| JP | 2019-215941 A | 12/2019 |

(Continued)

OTHER PUBLICATIONS

Jiang, Zhewei, et al. "C3SRAM: An In-Memory-Computing SRAM Macro Based on Robust Capacitive Coupling Computing Mechanism." IEEE Journal of Solid-State Circuits 55.7 (2020): 1888-1897.

(Continued)

*Primary Examiner* — Tha-O H Bui
(74) *Attorney, Agent, or Firm* — NSIP Law

(57) ABSTRACT

A memory device includes a memory cell array connected to a first word line, a pair of second word lines, and a bit line and configured to perform a multiply-accumulate (MAC) operation depending on a ternary input provided from the pair of second word lines and a binary weight preset based on the first word line and the bit line; a peripheral circuit configured to control the memory cell array; and an ADC (analog-to-digital converter) circuit configured to convert a voltage value dependent on the MAC operation into a digital value.

8 Claims, 8 Drawing Sheets

(51) Int. Cl.
G11C 7/10 (2006.01)
G11C 7/16 (2006.01)

(58) Field of Classification Search
CPC ....... G11C 8/08; G11C 11/412; G11C 11/419;
G11C 11/413; G11C 7/1084
USPC ......................................................... 365/191
See application file for complete search history.

(56) References Cited

U.S. PATENT DOCUMENTS

2009/0016138 A1* 1/2009 Bhatia ................... G11C 11/419
365/226
2020/0301668 A1 9/2020 Li

FOREIGN PATENT DOCUMENTS

KR  10-2016-0019594 A  2/2016
KR  10-1615742 B1  4/2016

OTHER PUBLICATIONS

Korean Office Action issued on Jan. 23, 2024, in counterpart Korean Patent Application No. 10-2022-0017302 (6 pages).

* cited by examiner

FIG. 4

Input/Weight Decoding and Multiplication Truth Table

| Input | Weight | $WL_P$ | $WL_N$ | W | $C_{MSN}$ ($V_{MSN}$) |
|---|---|---|---|---|---|
| 0 | X | ½ $V_{DD}$ | | X | (½ $V_{DD}$) |
| −1 | −1 | $V_{SS}$ | $V_{DD}$ | $V_{SS}$ | ($V_{DD}$) |
| −1 | 1 | $V_{SS}$ | $V_{DD}$ | $V_{DD}$ | ($V_{SS}$) |
| 1 | −1 | $V_{DD}$ | $V_{SS}$ | $V_{SS}$ | ($V_{SS}$) |
| 1 | 1 | $V_{DD}$ | $V_{SS}$ | $V_{DD}$ | ($V_{DD}$) |

MEMORY DEVICE SUPPORTING
IN-MEMORY MAC OPERATION BETWEEN
TERNARY INPUT DATA AND BINARY
WEIGHT USING CHARGE SHARING
METHOD AND OPERATION METHOD
THEREOF

CROSS-REFERENCE TO RELATED
APPLICATIONS

This application claims priority under 35 U.S.C. § 119 to Korean Patent Application No. 10-2022-0017302 filed on Feb. 10, 2022, in the Korean Intellectual Property Office, the disclosures of which are incorporated by reference herein in their entireties.

BACKGROUND

Embodiments of the present disclosure relate to a memory device supporting an in-memory MAC operation between ternary input data and binary weights using a charge sharing method, and an operation method thereof.

Conventional cache memories are limited to relatively slow read/write operations compared to computational operations. However, as data demanded by the CPU increases recently, memory accesses increase, thereby increasing the load on the memory. In this case, to reduce the memory bottleneck phenomenon, which is an innate problem occurring in the memory, many computing in-memory structures that perform arithmetic operations in the memory in addition to reading/writing are being proposed.

In particular, Multiply-Accumulate (MAC) operations used in artificial neural networks account for 90% of the total operations, and although the operations are simple, the operations are very repetitive. Accordingly, data movement between the cache memory and the operator in a CPU is very frequent, which increases the load on the memory, resulting in a bottleneck phenomenon and a limit to performance. In addition, since energy consumption is very large when moving data between the memory and the operator, energy efficiency in the calculation process is very low.

SUMMARY

Embodiments of the present disclosure provide a memory device supporting an in-memory MAC operation between ternary input data and binary weights using a charge sharing method and an operation method thereof.

The technical problems to be achieved in various embodiments of the present disclosure are not limited to the above-mentioned matters, other technical problems not mentioned will be considered by those skilled in the art from various embodiments of the present disclosure to be described below.

According to an embodiment of the present disclosure, a memory device includes a memory cell array connected to a first word line, a pair of second word lines, and a bit line, and that performs a multiply-accumulate (MAC) operation depending on a ternary input provided from the pair of second word lines and a binary weight preset based on the first word line and the bit line; a peripheral circuit that controls the memory cell array; and an ADC (analog-to-digital converter) circuit that converts a voltage value dependent on the MAC operation into a digital value.

According to an embodiment, the ternary input may correspond to one of a first voltage, a second voltage, and an intermediate voltage that is an intermediate value of the first voltage.

According to an embodiment, the memory device may further include an input driver receiving an input signal and having an output terminal connected to the pair of second word lines, and the input driver may precharge the pair of second word lines with the first voltage and the second voltage, and may apply the ternary input to the pair of second word lines in dependence on the input signal when both the first voltage and the second voltage are converted to the intermediate voltage according to charge sharing between the pair of second word lines.

According to an embodiment, the input driver may drive the pair of second word lines with the first voltage and the second voltage, respectively when the input signal is a ternary value of '1', may maintain the pair of second word lines at the intermediate voltage when the input signal is a ternary value of '0', and may drive the pair of second word lines with the second voltage and the first voltage, respectively, when the input signal is a ternary value of '−1', and the ternary input may correspond to a driving voltage of the pair of second word lines.

According to an embodiment, the binary weight may be set to one of binary values '1' and '−1' according to a voltage applied from the bit line.

According to an embodiment, the memory cell array may be connected to a first operation control line, a second operation control line, and a common bit line.

According to an embodiment, the memory cell array may include a plurality of memory cells, and each of the plurality of memory cells may include: a static random access memory (SRAM) connected to the first word line and the pair of second word lines; a pair of first transistors connected between the pair of second word lines and a first node, and having a gate terminal connected to an output terminal of the SRAM; a second transistor connected between the first node and the second node and having a gate terminal connected to the first operation control line; and a third transistor connected between the second node and the common bit line, and having a gate terminal connected to the second operation control line.

According to an embodiment, the memory cell array, when an ON signal is received from the first operation control line, may charge the second node with charges corresponding to a value obtained by multiplying the ternary input by the binary weight, based on that one of the pair of first transistors is turned on based on the ternary input, and, when an OFF signal from the first operation control line and an ON signal from the second operation control line are received, may perform the MAC operation based on sharing charges charged in the second node to the common bit line.

According to an embodiment of the present disclosure, a method of operating a memory device includes performing a multiply-accumulate (MAC) operation depending on a ternary input provided from a pair of second word lines and a binary weight preset based on a first word line and a bit line; and converting a voltage value dependent on the MAC operation into a digital value.

According to an embodiment, the ternary input may correspond to one of a first voltage, a second voltage, and an intermediate voltage that is an intermediate value of the first voltage, and the method may further include precharging the pair of second word lines with the first voltage and the second voltage; and applying the ternary input to the pair of second word lines in dependence on an input signal when both the first voltage and the second voltage are converted to the intermediate voltage according to charge sharing between the pair of second word lines.

BRIEF DESCRIPTION OF THE FIGURES

The accompanying drawings are provided to facilitate a more thorough understanding of various embodiments of the present disclosure, and provide various embodiments of the present disclosure together with detailed descriptions. However, technical features of various embodiments of the present disclosure are not limited to specific drawings, and features disclosed in each drawing may be combined with each other to form a new embodiment. Reference numerals in each drawing mean structural elements.

FIG. 4 illustrates a truth table of a multiplication operation among MAC operations.

DETAILED DESCRIPTION

Figure 1:
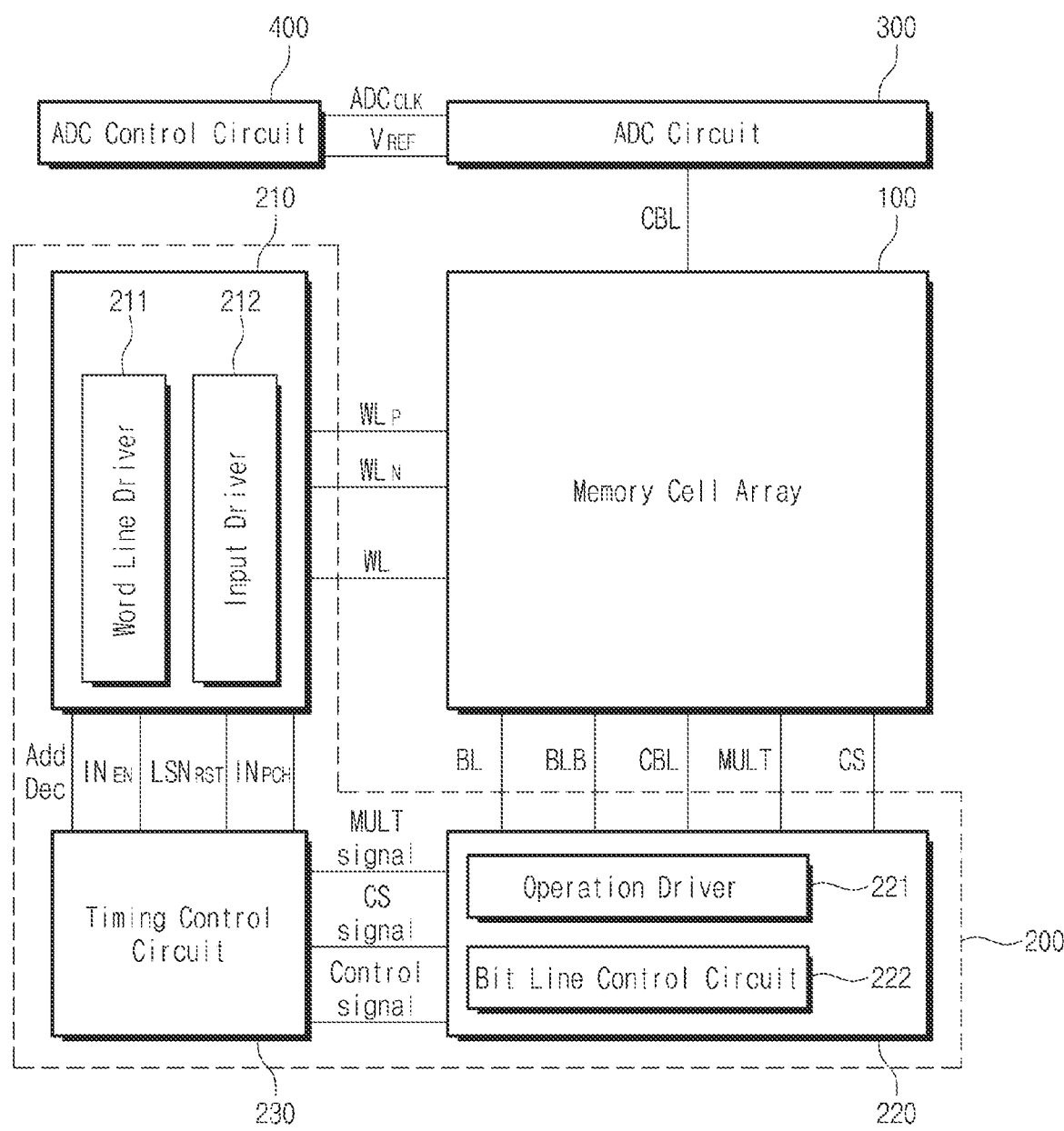
FIG. 1 illustrates a memory device, according to an embodiment according the present disclosure.

Hereinafter, embodiments of the present disclosure will be described in detail with reference to the accompanying drawings. The detailed description set forth below in conjunction with the accompanying drawings is intended to describe exemplary implementations of the present disclosure, and is not intended to represent the only implementation in which the present disclosure may be practiced. The following detailed description includes specific details for the purpose of providing a thorough understanding of the present disclosure. However, those skilled in the art appreciate that the present disclosure may be practiced without these specific details.

Since various embodiments according to the concept of the present disclosure may be made with various changes and may have various forms, various embodiments will be illustrated in the drawings and described in detail in the present disclosure. However, this is not intended to limit the various embodiments according to the concept of the present disclosure to specific disclosed forms, and includes modifications, equivalents, or substitutes included in the spirit and scope of the present disclosure.

Terms such as 'first' or 'second' may be used to describe various components, but the components should not be limited by the terms. The above terms are used only for the purpose of distinguishing one component from another component, for example, without departing from the scope of rights according to the concept of the present disclosure, a first component may be referred to as a second component, and similarly, the second component may also be referred to as the first component.

In various embodiments of this disclosure, "/" and "," should be interpreted as indicating "and/or". For example, "A/B" may mean "A and/or B". Furthermore, "A, B" may mean "A and/or B". Furthermore, "A/B/C" may mean "at least one of A, B and/or C". Furthermore, "A, B, C" may mean "at least one of A, B and/or C".

FIG. 1 illustrates a memory device, according to an embodiment according the present disclosure.

Referring to FIG. 1, a memory device 10 according to an embodiment of the present disclosure includes a memory cell array 100, a peripheral circuit 200, an ADC circuit 300, and an ADC control circuit 400.

The memory cell array 100 performs a read/write operation and a multiply-accumulate (MAC) operation depending on an applied voltage. In present disclosure, the MAC operation means a multiply-add operation. In detail, since the memory cell array 100 may perform the MAC operation, the memory device 10 of the present disclosure may be understood as having an in-memory structure capable of performing a calculation operation without a separate operator.

The memory cell array 100 is connected to the peripheral circuit 200 through a first word line WL, a pair of second word lines $WL_P$ and $WL_N$, bit lines BL and BLB, a common bit line CBL, a first operation control line MULT, and a second operation control line CS.

The first word line WL and the pair of second word lines $WL_P$ and $WL_N$ transmit a signal for selecting a memory cell included in the memory cell array 100, and in particular, the pair of second word lines $WL_P$ and $WL_N$ transmit a ternary input for the MAC operation described above. The bit lines BL and BLB transmit a logic value ('1' or '0') to be stored in each of a plurality of memory cells or transmit a stored logic value. The common bit line CBL transmits a result value of the MAC operation to the ADC circuit 300. Each of the first operation control line MULT and the second operation control line CS transmits an on/off signal for a multiplication operation and an addition operation of the MAC operation.

The memory cell array 100 performs the MAC operation depending on a ternary input from the pair of second word lines $WL_P$ and $WL_N$ and a binary weight preset based on the first word line WL and the bit lines BL and BLB. A detailed description of a specific operation of the MAC operation will be described later.

The memory cell array 100 includes a plurality of memory cells that are formed at points where the first word line WL, the pair of second word lines $WL_P$ and $WL_N$, the bit lines BL and BLB, and the common bit line CBL intersect each other. The plurality of memory cells may be divided into a plurality of pages connected to the first word line WL and the pair of second word lines $WL_P$ and $WL_N$, and a plurality of strings connected to the bit lines BL and BLB and the common bit line CBL. The number of the plurality of pages and the number of the plurality of strings may be set according to design.

The peripheral circuit 200 controls the memory cell array 100 and includes an X-axis peripheral circuit 210, a Y-axis peripheral circuit 220, and a timing control circuit 230.

The X-axis peripheral circuit 210 is connected to the memory cell array 100 through the first word line WL and the pair of second word lines $WL_P$ and $WL_N$, and includes a word line driver 211 and an input driver 212.

The word line driver 211 is connected to the memory cell array 100 through the first word line WL, and in more detail, is connected to each of the plurality of pages included in the memory cell array 100. The word line driver 211 drives each of the plurality of pages through the first word line WL based on control signals Add and DEC received from the timing control circuit 230. In detail, the plurality of pages are selected from the first word line WL by the word line driver 211.

The number of the input drivers 212 corresponding to the number of the first word lines WL may be provided, and the input drivers 212 are connected to the memory cell array 100 through the pair of second word lines $WL_P$ and $WL_N$, and specifically, are respectively connected to the plurality of pages. The input driver 212 receives an input signal and outputs a ternary input depending on the input signal to each of the plurality of pages through the pair of second word lines $WL_P$ and $WL_N$ based on an enabling signal $IN_{EN}$, a reset signal $LSN_{RST}$, and a precharge signal $IN_{PCH}$ provided from the timing control circuit 230. A detailed description of an operation of the input driver 212 outputting the ternary input will be described later.

The Y-axis peripheral circuit 220 is connected to the memory cell array 100 through the bit lines BL and BLB, the common bit line CBL, the first operation control line MULT, and the second operation control line CS, and includes an operation driver 221 and a bit line control circuit 222.

The operation driver 221 is connected to the memory cell array 100 through the first operation control line MULT and the second operation control line CS, and specifically, is connected to each of the plurality of strings. The operation driver 221 may allow the memory cell array 100 to perform the MAC operation by applying an on signal or an off signal to the first operation control line MULT and/or the second operation control line CS based on a multiplication signal MULT signal and an addition signal CS signal provided from the timing control circuit 230.

The bit line control circuit 222 is connected to the memory cell array 100 through the bit lines BL and BLB and the common bit line CBL. The bit line control circuit 222 may apply a logic value ('1' or '0') to be stored in each of the plurality of memory cells included in the memory cell array 100 or may read a logic value stored in each of the plurality of memory cells, based on a control signal provided from the timing control circuit 230. Alternatively, the bit line control circuit 222 may transfer the charges stored in the common bit line CBL according to the MAC operation to the ADC circuit 300.

The timing control circuit 230 applies various signals for controlling the above-described X-axis peripheral circuit 210 and Y-axis peripheral circuit 220 according to a set timing.

The ADC circuit 300 is connected to the common bit line CBL and converts a voltage value according to the MAC operation into a digital value. A plurality of ADC circuits 300 may be provided as many as the number of the common bit lines CBL.

The ADC control circuit 400 is connected to the ADC circuit 300 to control the ADC circuit 300. For example, the ADC control circuit 400 may control the ADC circuit 300 based on generating and applying a clock signal $ADC_{CLK}$ and a reference voltage $V_{REF}$ for ADC conversion to the ADC circuit 300.

Hereinafter, the above-described memory cell array 100 and memory cells included in the memory cell array 100 will be described in detail.

Figure 2A:
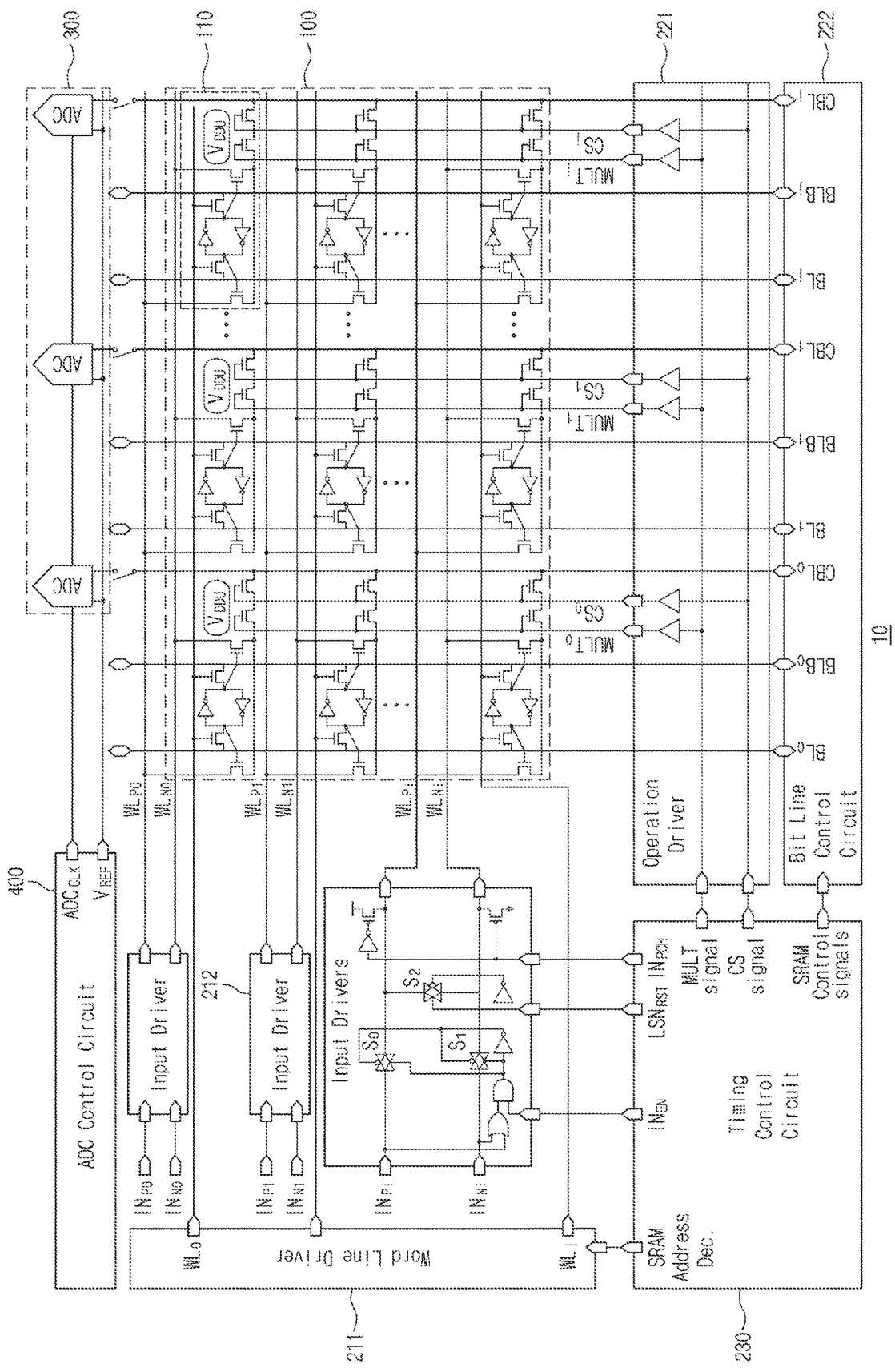
FIG. 2A is a circuit diagram of a memory device including a specific circuit diagram of a memory cell array.
Figure 2B:
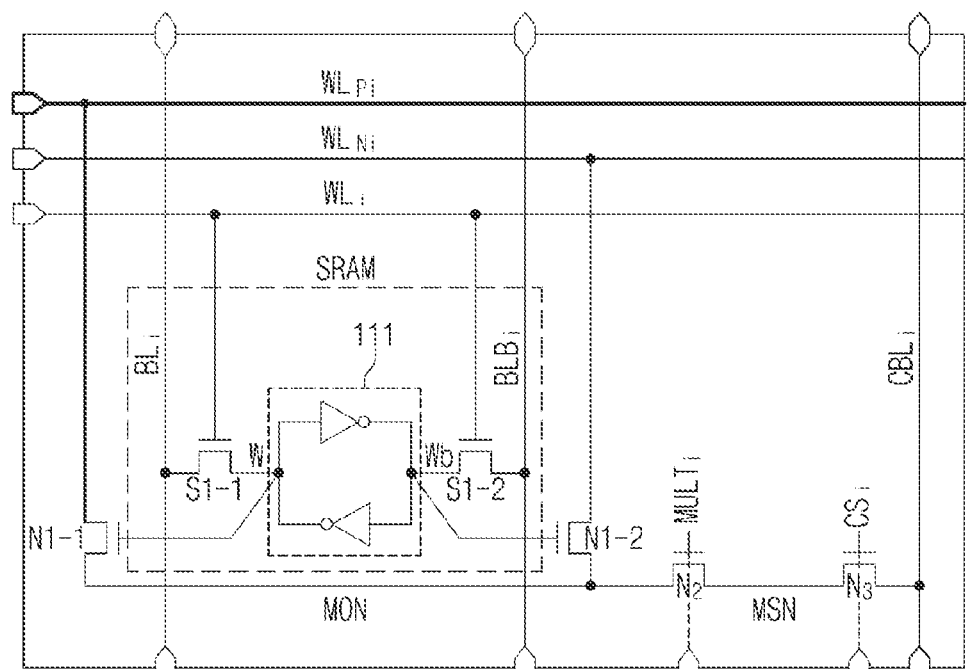
FIG. 2B is a circuit diagram of a memory cell included in a memory cell array.

FIG. 2A is a circuit diagram of a memory device including a specific circuit diagram of a memory cell array, and FIG. 2B is a circuit diagram of a memory cell included in a memory cell array.

In FIGS. 2A and 2B, a plurality of lines are illustrated for convenience in describing the memory cell array in detail.

Referring to FIGS. 2A and 2B, the memory cell array 100, as described above, is connected to first word lines $WL_0$ to $WL_i$, a pair of second word lines $WL_{P0}$ and $WL_{N0}$ to $WL_{Pi}$ and $WL_{Ni}$, bit lines $BL_0$ to $BL_j$ and $BLB_0$ to $BLB_j$, common bit lines $CBL_0$ to $CBL_j$, first operation control lines $MULT_0$ to $MULT_j$, and second operation control lines $CS_0$ to $CS_j$ to perform the MAC operations. Here, 'i' and 'j' are natural numbers and may be set according to design. A ternary input applied to the pair of second word lines $WL_{P0}$ and $WL_{N0}$ to $WL_{Pi}$ and $WL_{Ni}$ to perform the MAC operation is output from input signals $IN_{P0}$ and $IN_{N0}$ to $IN_{Pi}$ and $IN_{Ni}$ through the input driver 212.

The plurality of memory cells 110 included in the memory cell array 100 are divided into a plurality of pages connected to the first word lines $WL_0$ to $WL_i$ and the pair of second word lines $WL_{P0}$ and $WL_{N0}$ to $WL_{Pi}$ and $WL_{Ni}$, respectively, and a plurality of strings connected to each of the bit lines $BL_0$ to $BL_j$ and $BLB_0$ to $BLB_j$.

The memory cell 110 includes a static random access memory (SRAM), a pair of first transistors N1-1 and N1-2, a second transistor N2, and a third transistor N3.

The SRAM may be, for example, a 6T (transistor) SRAM. The SRAM is connected to each of the first word lines $WL_0$ to $WL_i$ and each of the pair of second word lines $WL_{P0}$ and $WL_{N0}$ to $WL_{Pi}$ and $WL_{Ni}$. The SRAM includes a pair of cross-coupled inverters 111 and a pair of transistors S1-1 and S1-2 connected between the pair of inverters 111 and the first word lines $WL_0$ to $WL_i$. When the pair of transistors S1-1 and S1-2 from the first word lines $WL_0$ to $WL_i$ are turned on, the SRAM reads values of the bit lines $BL_0$ to $BL_j$ and $BLB_0$ to $BLB_j$, and the values of the read bit lines $BL_0$ to $BL_j$ and $BLB_0$ to $BLB_j$ are stored in output terminals W and Wb of the SRAM connected to the pair of inverters.

For example, binary weights may be stored in the output terminals W and Wb. In the present disclosure, a binary weight is set for each memory cell 110 for the MAC operation, and the setting here may be understood as storing the binary weight in the memory cell 110. The binary weight may be one of the binary values '1' and '−1'. When the binary weight is selected from the first word lines $WL_0$ to $WL_i$, the binary weight may be set to one of '1' and '−1' depending on voltages applied from the bit lines $BL_0$ to $BL_j$ and $BLB_0$ to $BLB_j$.

In detail, when the plurality of strings included in the memory cell array 100 are selected from the first word lines $WL_0$ to $WL_i$, the SRAM of each memory cell 110 included in the plurality of strings reads values of the bit lines $BL_0$ to $BL_j$ and $BLB_0$ to $BLB_j$ and stores the read values in the output terminals W and Wb. In this case, the stored values of the bit lines $BL_0$ to $BL_j$ and $BLB_0$ to $BLB_j$ may be one of binary values '1' and '−1'.

The pair of first transistors N1-1 and N1-2 are connected between the pair of second word lines $WL_{P0}$ and $WL_{N0}$ to $WL_{Pi}$ and $WL_{Ni}$ and a first node MON, and have gate terminals connected to the output terminals W and Wb of the SRAM, respectively. A source of each of the pair of first transistors N1-1 and N1-2 is connected to each of the pair of second word lines $WL_{P0}$ and $WL_{N0}$ to $WL_{Pi}$ and $WL_{Ni}$. The pair of first transistors N1-1 and N1-2 are turned on and off depending on the output terminals W and Wb of the SRAM, and when turned on, the pair of first transistors N1-1 and N1-2 applies signals transmitted from the pair of second word lines $WL_{P0}$ and $WL_{N0}$ to $WL_{Pi}$ and $WL_{Ni}$ to the first node MON and a second node MSN. When a second transistor N2, which will be described later, is turned on, the second node MSN is charged with charges corresponding to signals transferred from the pair of second word lines $WL_{P0}$ and $WL_{N0}$ to $WL_{Pi}$ and $WL_{Ni}$. In this case, charging the second node MSN may be understood as charging a capacitance of the second node MSN.

As described above, since a charge charging operation on the second node MSN according to the SRAM and the pair of first transistors N1-1 and N1-2 is performed based on the values stored in the output terminals W and Wb of the SRAM, that is, the binary weight and the ternary input transferred from the pair of first transistors N1-1 and N1-2, this may correspond to the multiplication operation of the MAC operation by the binary weight and the ternary input.

The second transistor N2 is connected between the first node MON and the second node MSN, and has a gate terminal connected to the first operation control lines $MULT_0$ to $MULT_j$. The second transistor N2 is turned on or off according to a signal of the first operation control lines $MULT_0$ to $MULT_j$. The second transistor N2 is conducted when an ON signal is received from the first operation control lines $MULT_0$ to $MULT_j$, and charges corresponding to a value obtained by multiplying the ternary input by the binary weight are charged in the second node MSN, based on that one of the pair of first transistors N1-1 and N1-2 is turned on based on the ternary input.

The third transistor N3 is connected between the second node MSN and the common bit lines $CBL_0$ to $CBL_j$, and has a gate terminal connected to the second operation control lines $CS_0$ to $CS_j$. The third transistor N3 is conducted when the ON signal from the second operation control lines $CS_0$ to $CS_j$ is received, and transfers the charges charged in the second node MSN to the common bit lines $CBL_0$ to $CBL_j$, that is, shares the charges.

Since the common bit lines $CBL_0$ to $CBL_j$ connected to the third transistor N3 are connected to the string of the memory cell array 100 as described above, when the third transistor N3 is conductive, the common bit lines $CBL_0$ to $CBL_j$ share all of charges of the string. Accordingly, sharing the charges charged in the second node MSN through the common bit lines $CBL_0$ to $CBL_j$ may correspond to the addition operation of the MAC operation.

Hereinafter, the MAC operation performed by the above-described memory device 10 will be described based on operating waveforms.

Figure 3:
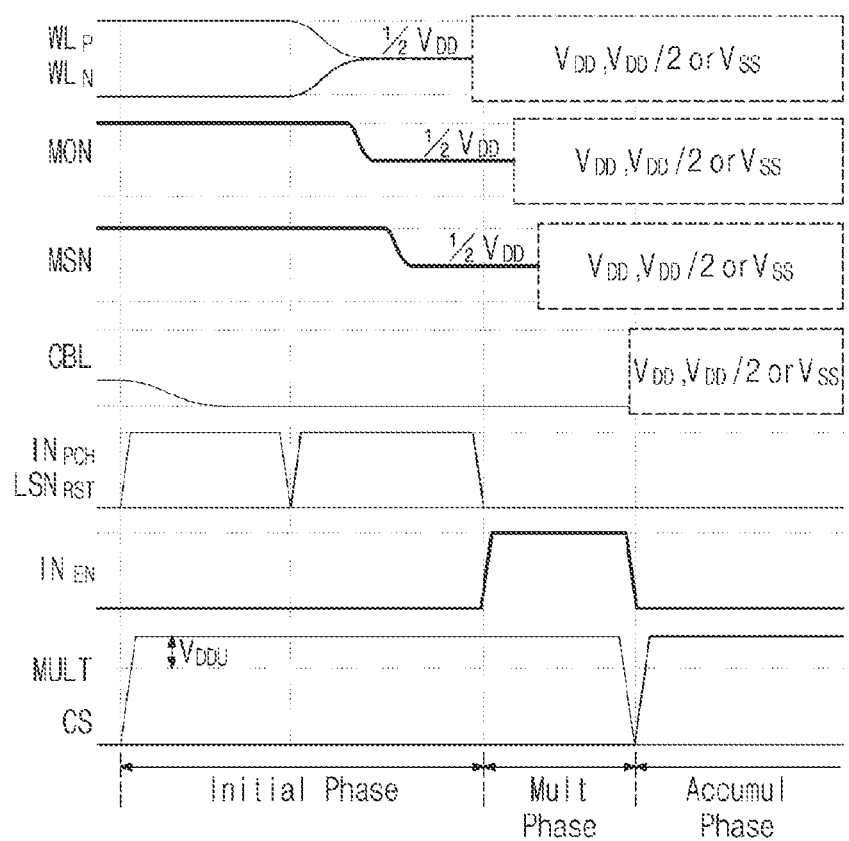
FIG. 3 is operating waveforms for describing a MAC operation.

FIG. 3 is operating waveforms for describing a MAC operation.

Referring to FIG. 3, the MAC operation is performed depending on a ternary input and a preset binary weight as described above. The binary weights required for the MAC operation are set through SRAM in advance as described above.

As described above, the ternary input is output by the input driver 212 from the pair of second word lines $WL_P$ and $WL_N$. In detail, the ternary input is output in an initial (initialization) phase and a mult (multiplication) phase. A signal of the first operation control line MULT is applied in the initial phase and the mult phase.

In the initial phase, the input driver 212 first precharges a pair of second word lines to a first voltage and a second voltage through the precharge signal $IN_{PCH}$. In this disclosure, the first voltage may be a supply voltage (e.g., VDD) and the second voltage may be a ground voltage (e.g., VSS).

Subsequently, the input driver 212 allows the charges precharged in the pair of second word lines $WL_P$ and $WL_N$ to be shared through the reset signal $LSN_{RST}$ so that both the first voltage and the second voltage are converted to the intermediate voltage VDD/2.

When both the first voltage and the second voltage are converted to the medium voltage, in the mult phase, the input driver 212 applies a ternary input depending on the input signal through the enabling signal $IN_{EN}$ to the pair of second word lines $WL_P$ and $WL_N$. The input signal may be one of the ternary values '1', '0', and '−1'.

For example, when the input signal is a ternary value of '1', the input driver 212 drives the pair of second word lines $WL_P$ and $WL_N$ with the first voltage and the second voltage, respectively. For example, when the input signal has a ternary value of '0', the input driver 212 maintains the pair of second word lines at the intermediate voltage. For example, when the input signal is a ternary value of '−1', the input driver 212 drives the pair of second word lines $WL_P$ and $WL_N$ with the second voltage and the first voltage, respectively. In this case, the ternary input may correspond to the driving voltage of the pair of second word lines $WL_P$ and $WL_N$. Accordingly, the input driver 212 may output a ternary input corresponding to one of the first voltage, the intermediate voltage, and the second voltage from the ternary values to the memory cell array 100.

When the pair of second word lines $WL_P$ and $WL_N$ maintain the intermediate voltage as the precharged charges are shared, the voltages of the first node MON and the second node MSN are also sequentially converted to the intermediate voltage. In this state, when the pair of second word lines $WL_P$ and $WL_N$ are driven as ternary inputs according to the enabling signal $IN_{EN}$, a multiplication operation among the MAC operations is performed in the mult phase. In the mult phase, the second node MSN is charged with charges corresponding to a value obtained by multiplying the ternary input by the binary weight.

Subsequently, in an accumul (accumulate) phase in which a signal of the second operation control line CS is applied, as the third transistor N3 is conducted, the charges of the second node MSN are shared to the common bit line CBL, and thus the addition operation of the MAC operation is performed.

FIG. 4 illustrates a truth table of a multiplication operation among MAC operations.

Referring to FIG. 4, it may be confirmed that the second node MSN is charged with charges $C_{MSN}(V_{MSN})$ corresponding to a value obtained by multiplying the ternary input and the binary weight. In FIG. 4, Input and Weight respectively correspond to the ternary value of the input signal and the binary value of the binary weight, $WL_P$ and $WL_N$ correspond to the voltage values of the ternary input, and W corresponds to the voltage value of the binary weight.

For example, when the ternary input is '0', the result of the multiplication operation is '0' regardless of the binary weight, and the intermediate voltage corresponding to '0' is charged to the second node MSN.

For example, when the ternary input is '−1', the first voltage VDD or the second voltage VSS, which is the voltage corresponding to '1' or '−1', respectively, which is the result of the multiplication operation according to the binary weight ('−1' or '1') is charged to the second node MSN.

For example, when the ternary input is '1', the second voltage VSS or the first voltage VDD, which is the voltage corresponding to '−1' or '1', respectively, which is the result of the multiplication operation according to the binary weight ('−1' or '1') is charged to the second node MSN.

According to the memory device 10 according to various embodiments of the present disclosure described above, the MAC operation through the charge sharing method may be performed in the in-memory structure, so that the number of times of data movement may be reduced and energy efficiency may be increased. This may be particularly effective in a structure that performs a MAC operation on a large amount of data, such as an artificial neural network. In addition, since the MAC operation is performed through the charge sharing method, there are advantages in that sensitivity to variations in the process is low and the linearity of the transfer function of the MAC operation is high.

Hereinafter, a method of operating the memory device 10 described above will be described. The detailed description of redundant components is omitted to avoid redundancy.

Figure 5:
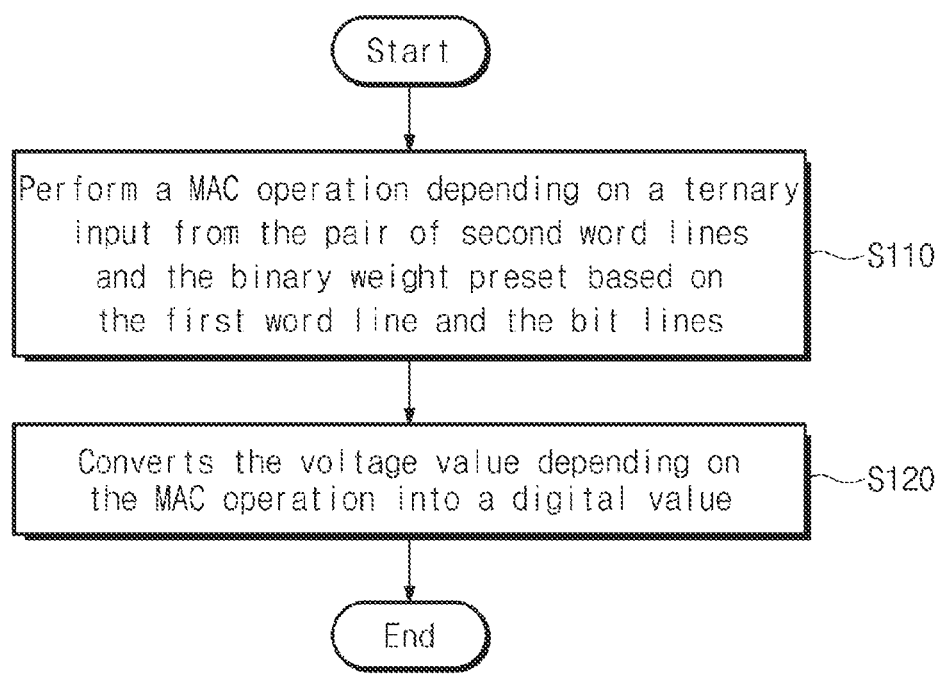
FIG. 5 is a flowchart of a method of operating a memory device, according to an embodiment of the present disclosure.

FIG. 5 is a flowchart of a method of operating a memory device, according to an embodiment of the present disclosure.

Referring to FIG. 5, in operation S110, the memory device 10 may perform a MAC operation depending on a ternary input from the pair of second word lines $WL_P$ and $WL_N$ and the binary weight preset based on the first word line WL and the bit lines BL and BLB.

In operation S120, the memory device 10 converts the voltage value depending on the MAC operation into a digital value.

Figure 6:
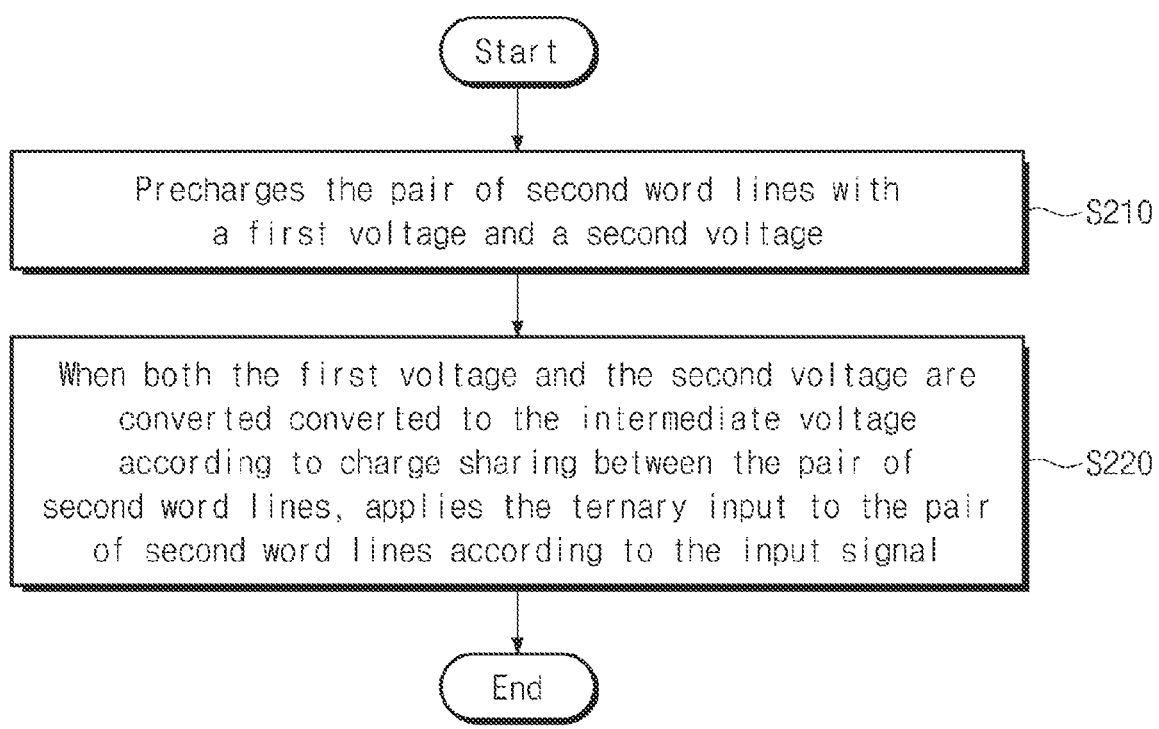
FIG. 6 is a flowchart of a ternary input/output method, according to an embodiment of the present disclosure.

FIG. 6 is a flowchart of a ternary input/output method, according to an embodiment of the present disclosure.

Referring to FIG. 6, in operation S210, the memory device 10 precharges the pair of second word lines $WL_P$ and $WL_N$ with a first voltage and a second voltage.

In operation S220, when both the first voltage and the second voltage are converted to the intermediate voltage according to charge sharing between the pair of second word lines $WL_P$ and $WL_N$, the memory device 10 applies the ternary input to the pair of second word lines $WL_P$ and $WL_N$ according to the input signal.

Figure 7:
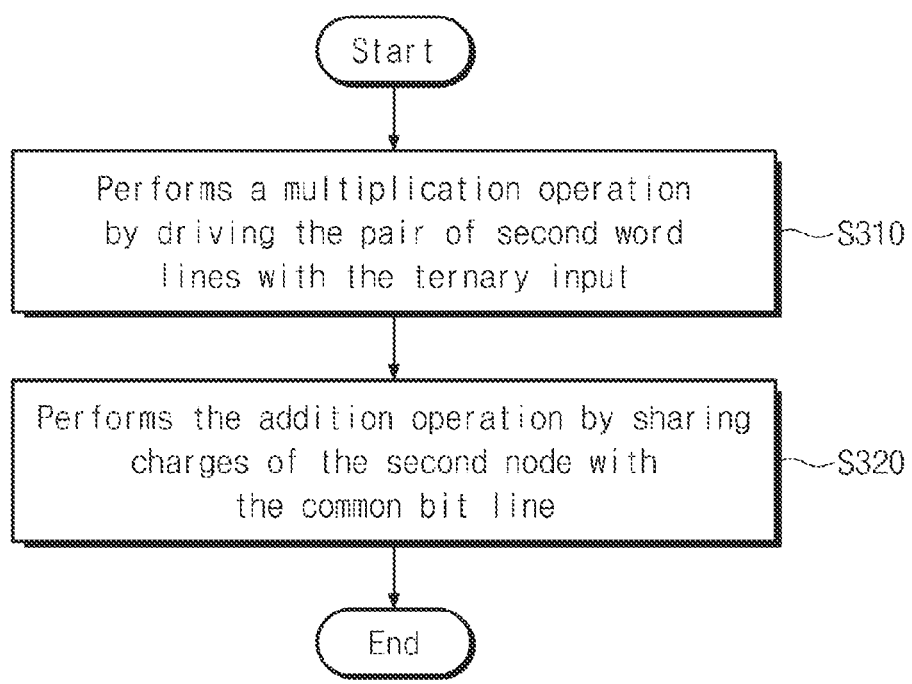
FIG. 7 is a flowchart of a MAC operation method, according to an embodiment of the present disclosure.

FIG. 7 is a flowchart of a MAC operation method, according to an embodiment of the present disclosure.

Referring to FIG. 7, in operation S310, the memory device 10 performs a multiplication operation by driving the pair of second word lines $WL_P$ and $WL_N$ with the ternary input. Through the multiplication operation, the second node MSN is charged with charges corresponding to a value obtained by multiplying the ternary input by the binary weight.

In operation S320, the memory device 10 performs the addition operation by sharing charges of the second node MSN with the common bit line CBL.

Since the embodiments of the proposed method in the above description may also be included as one of the implementation methods of the present disclosure, it is obvious that they may be regarded as a kind of proposed methods. In addition, the above-described proposed methods may be implemented independently, but may also be implemented in a combination (or merged) form of some proposed methods.

The various embodiments of the present disclosure described above are only some of the preferred embodiments of the present disclosure, and various embodiments in which the technical features of the various embodiments of the present disclosure are reflected will be derived and understood based on detailed descriptions to be described below by those of ordinary skill in the art.

According to various embodiments of the present disclosure, there are the following advantages.

According to various embodiments of the present disclosure, a memory device that supports an in-memory MAC operation between ternary input data and binary weights using a charge sharing method, capable of increasing energy efficiency by reducing the number of data movement between the memory and the operator by performing the MAC operation in the memory, and an operation method thereof may be provided.

In addition, as the sensitivity to variations in the process is low, and as the linearity of the transfer function of the MAC operation output is high, accurate operations may be possible.

Effects obtainable from various embodiments of the present disclosure are not limited to the effects mentioned above, and other effects not mentioned will be clearly derived and understood by those skilled in the art based on the detailed description above.

Embodiments of the present disclosure disclosed as described above are provided to enable those skilled in the art to implement and practice the present disclosure. Although the above description has been described with reference to embodiments of the present disclosure, those skilled in the art may variously modify and change the embodiments of the present disclosure. Thus, the present disclosure is not intended to be limited to the examples set forth herein but is intended to be accorded the widest scope consistent with the principles and novel features disclosed herein.

What is claimed is:

1. A memory device comprising:
a memory cell array connected to a first word line, a pair of second word lines, a first operation control line, a second operation control line, a common bit line, and a bit line, and configured to perform a multiply-accumulate (MAC) operation depending on a ternary input provided from the pair of second word lines and a binary weight preset based on the first word line and the bit line;
a peripheral circuit configured to control the memory cell array; and
an ADC (analog-to-digital converter) circuit configured to convert a voltage value dependent on the MAC operation into a digital value,
wherein each memory cell arranged in the memory cell array comprises:
a static random access memory (SRAM) connected to the first word line and the pair of second word lines;
a pair of first transistors connected between the pair of second word lines and a first node, each first transistor having a gate terminal connected to an output terminal of the SRAM;
a second transistor connected between the first node and a second node, and having a gate terminal connected to the first operation control line; and
a third transistor connected between the second node and the common bit line, and having a gate terminal connected to the second operation control line.

2. The memory device of claim 1, wherein the ternary input corresponds to one of a first voltage, a second voltage, and an intermediate voltage which is an intermediate value of the first voltage.

3. The memory device of claim 2, further comprising:
an input driver receiving an input signal and having an output terminal connected to the pair of second word lines, and
wherein the input driver is configured to:
precharge the pair of second word lines with the first voltage and the second voltage, and
apply the ternary input to the pair of second word lines in dependence on the input signal when both the first voltage and the second voltage are converted to the intermediate voltage according to charge sharing between the pair of second word lines.

4. The memory device of claim 3, wherein the input driver is configured to:
  drive the pair of second word lines with the first voltage and the second voltage, respectively when the input signal is a ternary value of '1';
  maintain the pair of second word lines at the intermediate voltage when the input signal is a ternary value of '0'; and
  drive the pair of second word lines with the second voltage and the first voltage, respectively, when the input signal is a ternary value of '−1', and
  wherein the ternary input corresponds to a driving voltage of the pair of second word lines.

5. The memory device of claim 1, wherein the binary weight is set to one of binary values '1' and '−1' according to a voltage applied from the bit line.

6. The memory device of claim 1, wherein, when an ON signal is received from the first operation control line, the memory cell array charges the second node with charges corresponding to a value obtained by multiplying the ternary input by the binary weight, based on that one of the pair of first transistors is turned on based on the ternary input, and
  wherein, when an OFF signal from the first operation control line and an ON signal from the second operation control line are received, the memory cell array performs the MAC operation based on sharing charges charged in the second node to the common bit line.

7. A method of operating a memory device comprising a memory cell array connected to a first word line, a pair of second word lines, a first operation control line, a second operation control line, a common bit line, and a bit line, and configured to perform a multiply-accumulate (MAC) operation depending on a ternary input provided from the pair of second word lines and a binary weight preset based on the first word line and the bit line, the method comprising:
  performing a multiply-accumulate (MAC) operation depending on a ternary input provided from a pair of second word lines and a binary weight preset based on a first word line and a bit line; and
  converting a voltage value dependent on the MAC operation into a digital value,
  wherein each memory cell arranged in the memory cell array comprises:
  a static random access memory (SRAM) connected to the first word line and the pair of second word lines;
  a pair of first transistors connected between the pair of second word lines and a first node, each first transistor having a gate terminal connected to an output terminal of the SRAM;
  a second transistor connected between the first node and a second node, and having a gate terminal connected to the first operation control line; and
  a third transistor connected between the second node and the common bit line, and having a gate terminal connected to the second operation control line.

8. The method of claim 7, further comprising:
  precharging the pair of second word lines with a first voltage and a second voltage, wherein the ternary input corresponds to one of the first voltage, the second voltage, and an intermediate voltage which is an intermediate value of the first voltage; and
  applying the ternary input to the pair of second word lines based on an input signal when both the first voltage and the second voltage are converted to the intermediate voltage according to charge sharing between the pair of second word lines.

* * * * *